(12) United States Patent
Kang et al.

(10) Patent No.: US 7,277,005 B2
(45) Date of Patent: Oct. 2, 2007

(54) PRINTED CIRCUIT BOARD INCLUDING EMBEDDED RESISTOR AND METHOD OF FABRICATING THE SAME

(75) Inventors: Myung Sam Kang, Daejeon (KR); Chang Sup Ryu, Daejeon (KR); Jong Kuk Hong, Chungcheongnam-do (KR)

(73) Assignee: Samsung Electro-Mechanics Co., Ltd., Kyunggi-do (KR)

( * ) Notice: Subject to any disclaimer, the term of this patent is extended or adjusted under 35 U.S.C. 154(b) by 216 days.

(21) Appl. No.: 11/022,074

(22) Filed: Dec. 22, 2004

(65) Prior Publication Data

US 2006/0049913 A1    Mar. 9, 2006

(30) Foreign Application Priority Data

Sep. 1, 2004    (KR) .................. 10-2004-0069626

(51) Int. Cl.
*H01C 1/012* (2006.01)

(52) U.S. Cl. .................. 338/309; 338/204; 338/249; 174/250; 219/121

(58) Field of Classification Search ........ 338/204–205, 338/249, 226, 309–314; 174/250, 255, 256; 428/699, 701, 702; 361/763; 219/121.69
See application file for complete search history.

(56) References Cited

U.S. PATENT DOCUMENTS 6,284,982 B1 * 9/2001 Kusner et al. .............. 174/255
6,541,137 B1 * 4/2003 Kingon et al. .............. 338/226
2004/0000425 A1 * 1/2004 White et al. ................ 174/250
2005/0175385 A1 * 8/2005 Cho et al. ............... 219/121.69

FOREIGN PATENT DOCUMENTS

| JP | 2000-340956 | 12/2000 |
|----|-------------|---------|
| JP | 2001-15909  | 1/2001  |
| JP | 2001-15920  | 1/2001  |
| JP | 2002-64274  | 2/2002  |
| JP | 2004-63722  | 2/2004  |

OTHER PUBLICATIONS

Patent Abstracts of Korea for 2002-48111 filed Aug. 14, 2002.
Patent Abstracts of Korea for 2001-76218 filed Dec. 4, 2001.

* cited by examiner

*Primary Examiner*—K. Richard Lee
(74) *Attorney, Agent, or Firm*—Darby & Darby

(57) ABSTRACT

Disclosed is a PCB including an embedded resistor and a method of fabricating the same. The PCB includes a plurality of circuit layers in which circuit patterns are formed. A plurality of insulating layers is each interposed between the circuit layers. The embedded resistor is made of a resistive material and received in a receiving hole formed in the plurality of circuit layers and the plurality of insulating layers such that walls defining the receiving hole extends from one of the circuit layers to another circuit layer. The receiving hole has a closed section, and a conductive material is plated on the opposite walls of the walls defining the receiving hole.

12 Claims, 19 Drawing Sheets

PRINTED CIRCUIT BOARD INCLUDING EMBEDDED RESISTOR AND METHOD OF FABRICATING THE SAME

BACKGROUND OF THE INVENTION

INCORPORATION BY REFERENCE

The present application claims priority under 35 U.S.C. §119 to Korean Patent Application No. 2004-69626 filed on Sep. 1, 2004. The content of the application is incorporated herein by reference in its entirety.

1. Field of the Invention

The present invention relates, in general, to a printed circuit board (PCB) including embedded resistors and a method of fabricating the same and, more particularly, to a PCB including embedded resistors, in which a resistive material is packed in a predetermined elongated hole for communicating with each other via holes, and in which walls of the via holes are used as resistor terminals, and a method of fabricating the same.

2. Description of the Prior Art

Recently, electronic technologies are moving toward the embedding of resistors, capacitors, integrated circuits (IC) or the like into a substrate so as to cope with demand for miniaturization and sophisticated functions of electronic goods according to advances in the electronics industry.

Typically, discrete chip resistors or discrete chip capacitors have been frequently mounted on most PCBs, but, recently, PCBs are developing in which passive components, such as resistors or capacitors, are embedded.

In other words, a technology for fabricating PCBs including the passive components embedded therein, achieves substitution of conventional chip resistors or chip capacitors by mounting the passive components on an external part of a PCB or in an internal part of the PCB according to a novel process employing a novel material (substance).

The PCB including the passive component embedded therein has a structure in which the resistor is mounted on the external part of the PCB or embedded in the internal part of the PCB, and if the resistor is integrated with the PCB to act as one part of the PCB regardless of the size of the PCB, the resistor is called an "embedded (buried) resistor" and the resulting PCB is called "printed circuit board including embedded resistor".

One of the most important features of the PCB including the resistors embedded therein is that since the resistors are already mounted as part of the PCB in the PCB, it is not necessary to mount additional chip resistors on a surface of the PCB.

FIGS. 1a to 1c illustrate the production of a conventional PCB including an embedded resistor.

As shown in FIG. 1a, two copper terminals 12, 12' spaced from each other are formed on a surface of a substrate 11.

As shown in FIG. 1b, a carbon resistor paste 14 is printed according to a screen printing process using a squeeze blade 13 between the copper terminals 12, 12' to form a thick film resistor 15.

As shown in FIG. 1c, a solder mask layer 16 is formed on an upper side of the thick film resistor 15 on the substrate 11.

The conventional PCB including the embedded resistor fabricated through the above procedure of FIGS. 1a to 1c is problematic in that the copper terminals 12, 12' exposed to external environments are readily oxidized because of a process delay between steps of FIGS. 1b and 1c.

Another problem is that if a solder mask liquid 16 is coated on the oxidized copper terminals 12, 12' in a subsequent process, the oxidation of the copper terminals 12, 12' is promoted.

Moreover, undesirably, the oxidation of the copper terminals 12, 12' reduces the attachment power at the interface between the thick film resistor 15 and the copper terminals 12, 12', and increases the resistance value.

Additionally, when a resistor paste is coated on a panel having a size of about 50×60 cm usually employed in the course of fabricating PCBs, a nonuniform thickness of the thick film resistor 15 leads to inconsistent resistance values, thereby reducing the reliability of final goods.

To avoid the above problems, Korean Pat. Laid-Open Publication No. 2003-46552 filed on Dec. 4, 2001 by the applicant of the present invention discloses the following method.

FIGS. 2a to 2f illustrate the production of a conventional PCB including an embedded resistor.

As shown in FIG. 2a, a pair of patterned resistor metal pads 22, 22' spaced from each other are formed on a substrate 21.

As shown in FIG. 2b, a solder mask layer 23 is formed on the substrate 21.

As shown in FIG. 2c, exposure and developing processes are carried out using a dry film (not shown) to strip the solder mask layer 23 covering a pair of metal pads 22, 22' and a portion of the substrate between the metal pads, thereby forming a solder mask opening.

As shown in FIG. 2d, nickel and gold are plated on a pair of resistor metal pads 22, 22' exposed through the solder mask opening to form conductive protection layers 24, 24', thereby forming resistor terminals.

As shown in FIG. 2e, a carbon resistor paste is printed according to a screen printing process between the resistor terminals so as to electrically connect the resistor terminals to each other, thereby forming a thick film resistor 25.

As shown in FIG. 2f, grooves 26, 26' are formed through a laser trimming process to adjust the resistance value of the resistor, formed as described above, to a desired value.

The conventional PCB including the embedded resistor fabricated through the procedure of FIGS. 2a to 2f is advantageous in that the conductive protection layers 24, 24' such as nickel/gold plating layers, are formed to prevent oxidation of surfaces of the resistor terminals and in that the laser trimming grooves 26, 26' are formed to assure a precise resistance value.

However, the PCB including the embedded resistor of FIGS. 2a to 2f is problematic in that since the resistor paste is coated through a screen printing process, the thickness of the resistor paste is nonuniform.

Another problem is that since the laser trimming process must be carried out for every embedded resistor to adjust the resistance value of the embedded resistor, the working speed is slow, resulting in significantly reduced productivity.

To overcome the above problems, Korean Pat. Laid-Open Publication No. 2004-15941 suggests a method of producing a PCB including an embedded resistor as follows.

FIGS. 3a to 3f illustrate the production of a conventional PCB including an embedded resistor.

As shown in FIG. 3a, a copper clad laminate is provided, in which copper thin films 32, 32' are coated on both sides of an insulating layer 31 made of epoxy.

As shown in FIG. 3b, a hole (a) having a desired diameter is formed through the copper clad laminate using a drill.

As shown in FIG. 3c, a resistive material 33 is packed in the hole (a) of the copper clad laminate using a vacuum printer, and is then semi-hardened at about 80° C. for about 1 hour.

As shown in FIG. 3d, protrusions on the resistive material 33 are removed using a surface grinder employing sandpaper to flatten surfaces of the resistive material, and subsequently the resistive material 33 is completely hardened at about 150° C. for about 1 hour.

As shown in FIG. 3e, copper plating layers 34, 34' are formed on the entire surface of the copper clad laminate.

As shown in FIG. 3f, after a photoresistor is coated on the copper plating layers 34, 34', and exposed and developed to form resistor terminals 32, 32', 34, 34', the photoresistor is removed.

The conventional PCB including the embedded resistor fabricated through a procedure of FIGS. 3a to 3f is advantageous in that since a laser trimming process is not employed, productivity is excellent.

Another advantage is that the resistive material 33 is packed using the vacuum printer and trimmed using the surface grinder employing sandpaper, thereby assuring relatively uniform resistance values.

However, the PCB including the embedded resistor of FIGS. 3a to 3f is problematic in that since the resistor is formed perpendicular to the PCB, when a resistor having a high resistance value is needed, it is difficult to increase a length of the embedded resistor or reduce a sectional area of the hole (a).

Furthermore, the PCB is problematic in that a limit of the resistance value of the embedded resistor restricts the freedom in designing the PCB, and thus, it is difficult to realize miniaturization and sophisticated functions of final electronic goods.

SUMMARY OF THE INVENTION

Therefore, the present invention has been made keeping in mind the above disadvantages occurring in the prior arts, and an object of the present invention is to provide a PCB including embedded resistors, which assures consistency of resistance values of the embedded resistors, and a method of fabricating the same.

Another object of the present invention is to provide a PCB including embedded resistors in high density, in which the number of embedded resistors per unit area can increase, and a method of fabricating the same.

A further object of the present invention is to provide a PCB including embedded resistors, in which a length or a sectional area of each embedded resistor is easily controlled, and a method of fabricating the same.

The above objects can be accomplished by providing a PCB including an embedded resistor, which comprises a plurality of circuit layers in which circuit patterns are formed. A plurality of insulating layers is each interposed between the circuit layers. The embedded resistor is made of a resistive material and received in a receiving hole formed in the plurality of circuit layers and the plurality of insulating layers such that walls defining the receiving hole extends from one of the circuit layers to another circuit layer. The receiving hole has a closed section, and a conductive material is plated on the opposite walls of the walls defining the receiving hole.

It is preferable that the closed section of the embedded resistor is of an oblong shape, and the conductive material is plated on the opposite walls corresponding to opposite semicircular ends of the receiving hole.

It is preferable that the closed section of the embedded resistor is of a dumbbell shape, and the conductive material is plated on the opposite walls corresponding to opposite arciform ends of the receiving hole.

It is preferable that the closed section of the embedded resistor is of a rectangular shape having semicircles protruding from opposite sides thereof, a diameter of each of the semicircles is smaller than a length of a side from which each of the semicircles protrudes, and the conductive material is plated on the opposite walls corresponding to the opposite protruding semicircular ends of the receiving hole.

Furthermore, the present invention provides a method of fabricating a PCB including embedded resistors, which comprises (A) forming a plurality of via holes through a substrate, and forming copper plating layers on external surfaces and walls of the via holes of the substrate; (B) removing a portion between at least two via holes of the plurality of via holes to form a receiving hole, and packing resistive material in the receiving hole; and (C) forming predetermined circuit patterns on the substrate on which the copper plating layers are formed.

It is preferable that the method further comprises (D) removing a portion of the resistive material protruding from the external surfaces of the substrate so that resistance values of the resistive materials packed in the via holes are consistent after the step (B).

It is preferable that the removing of the portion between at least two via holes of the plurality of via holes is conducted using at least one of computer numerical control (CNC) drill, router drill, and metal mold punch processes, thereby forming the receiving hole in the step (B).

It is preferable that the packing of the resistive materials in the receiving hole is conducted through a screen printing process in the step (B).

It is preferable that the portion of the resistive material protruding from the external layers of the substrate is removed using a buff in the step (D).

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
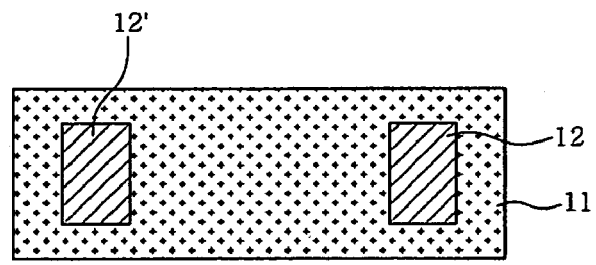
FIGS. 1a to 1c illustrate the production of a conventional PCB including an embedded resistor.
Figure 1B:
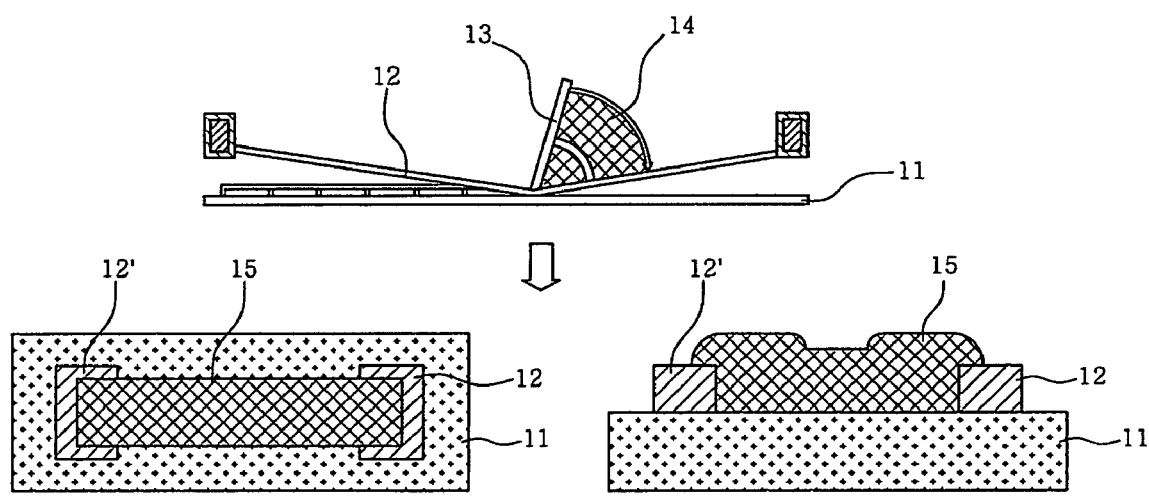
Figure 1C:
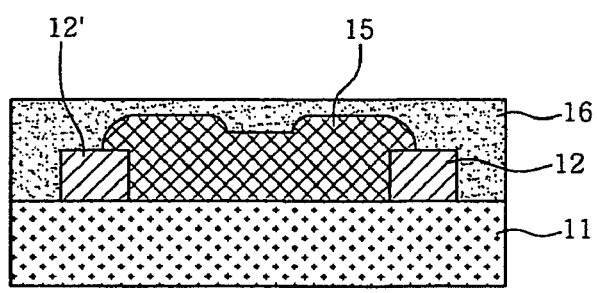
Figure 2A:
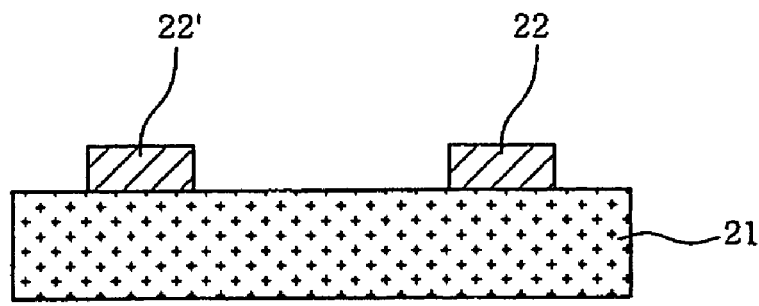
FIGS. 2a to 2f illustrate another production of the conventional PCB including an embedded resistor.
Figure 2B:
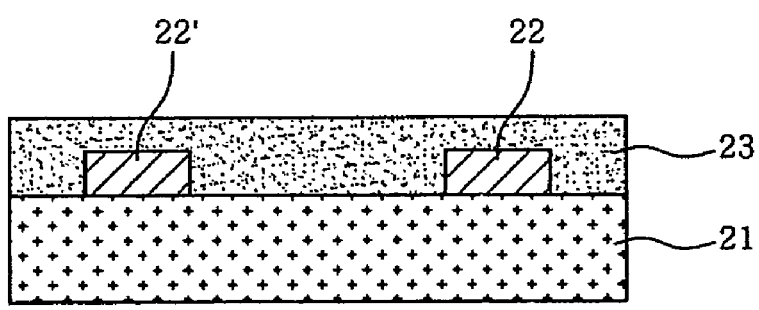
Figure 2C:
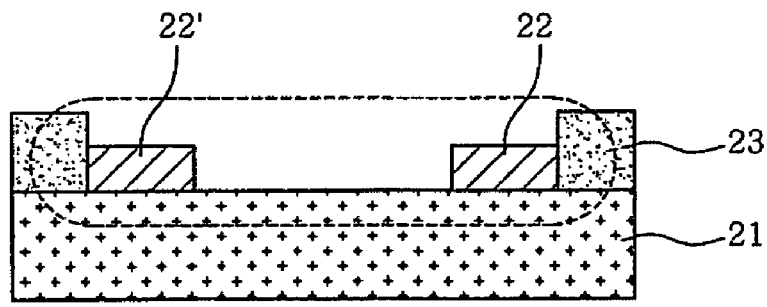
Figure 2D:
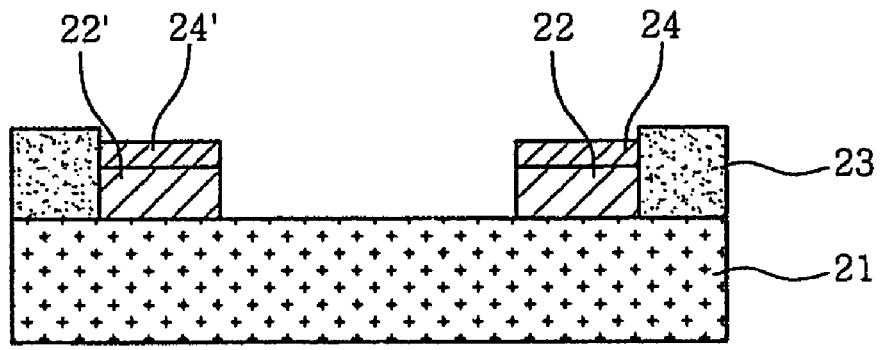
Figure 2E:
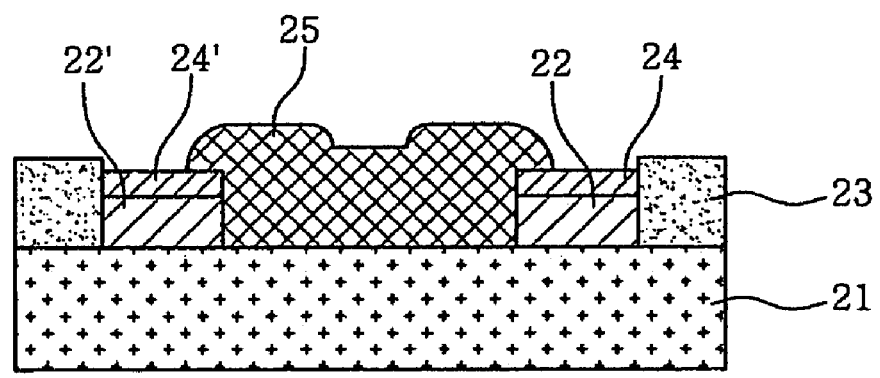
Figure 2F:
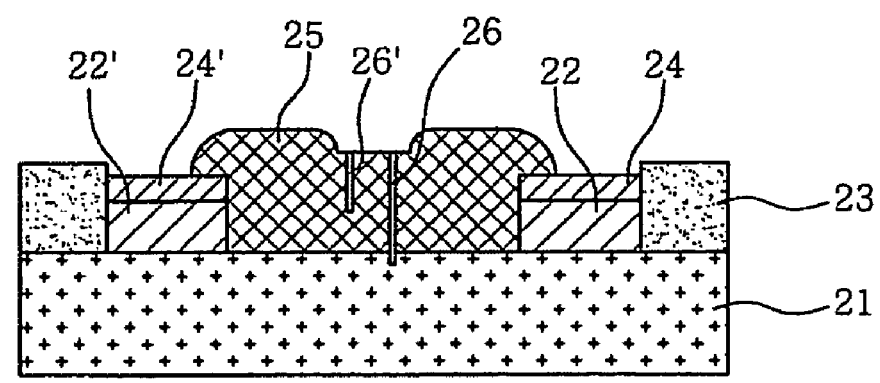
Figure 3A:
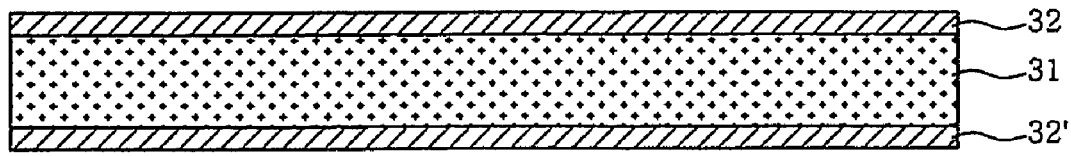
FIGS. 3a to 3f illustrate still another production of the conventional PCB including an embedded resistor.
Figure 3B:
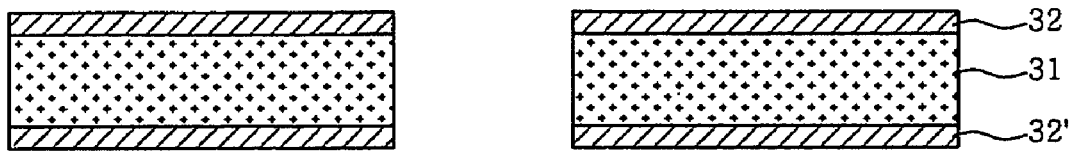
Figure 3C:
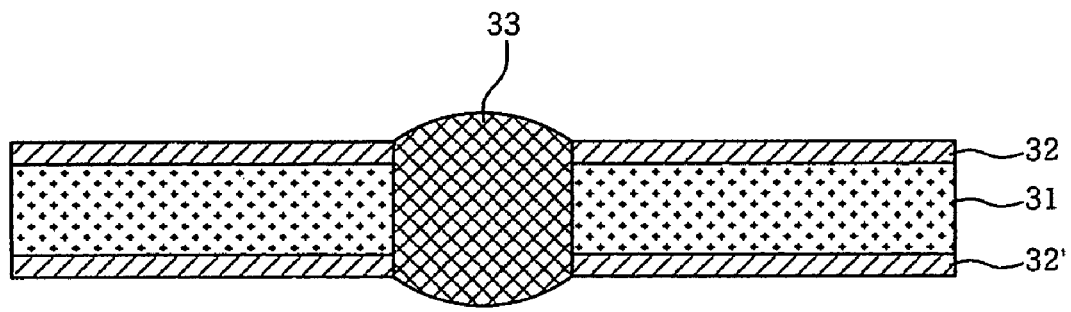
Figure 3D:
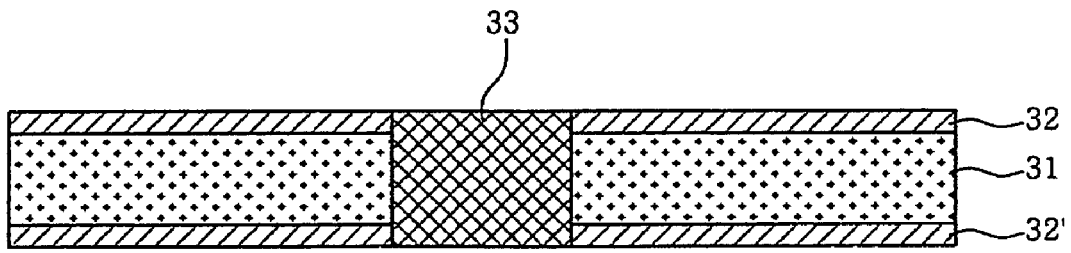
Figure 3E:
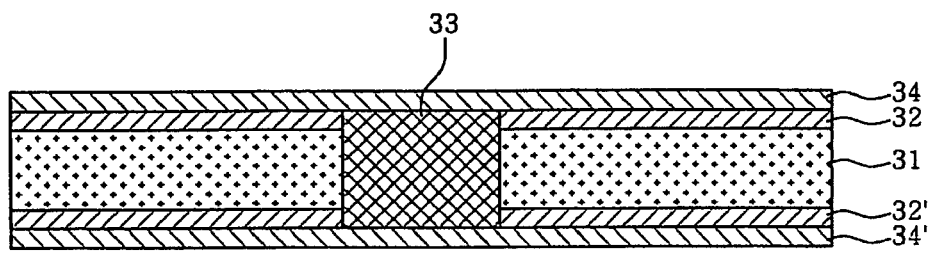
Figure 3F:
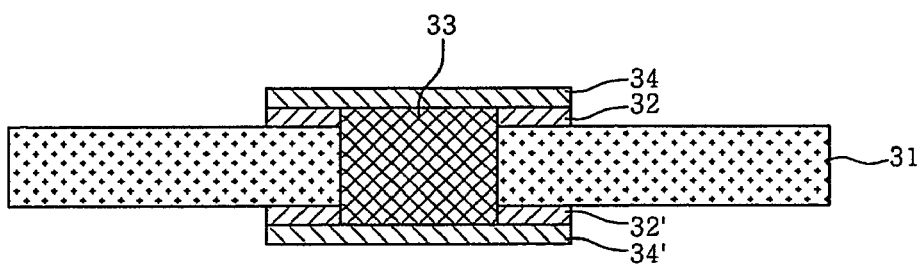

Hereinafter, a detailed description will be given of a PCB including embedded resistors and a method of fabricating the same according to the present invention, referring to the drawings.

Figure 4A:
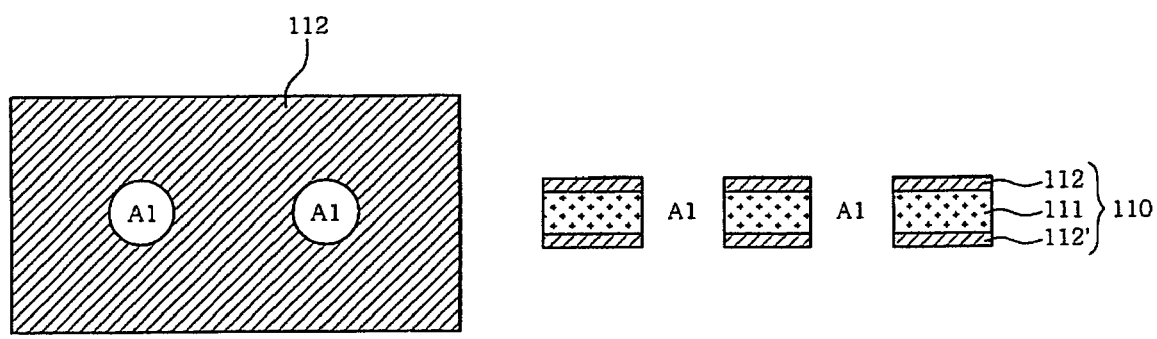
FIGS. 4a to 4h are top and sectional views illustrating a procedure of producing a PCB including an embedded resistor according to an embodiment of the present invention.
Figure 4B:
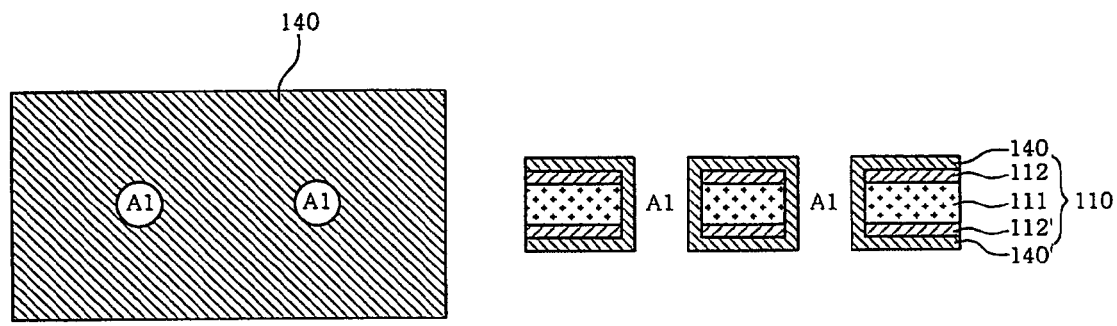
Figure 4C:
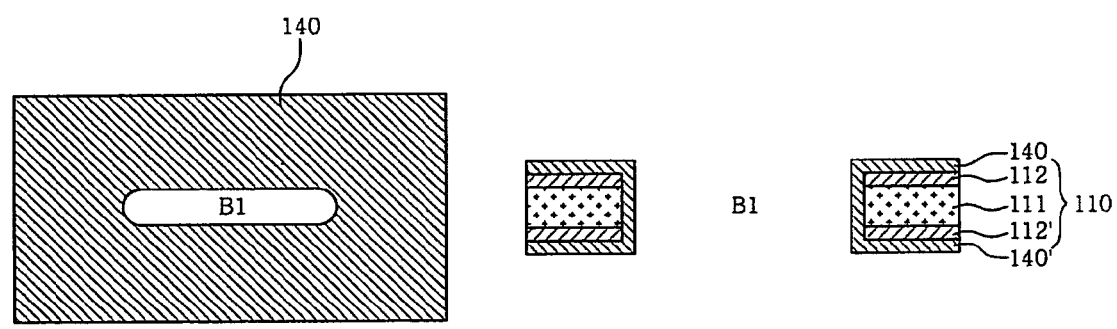
Figure 4D:
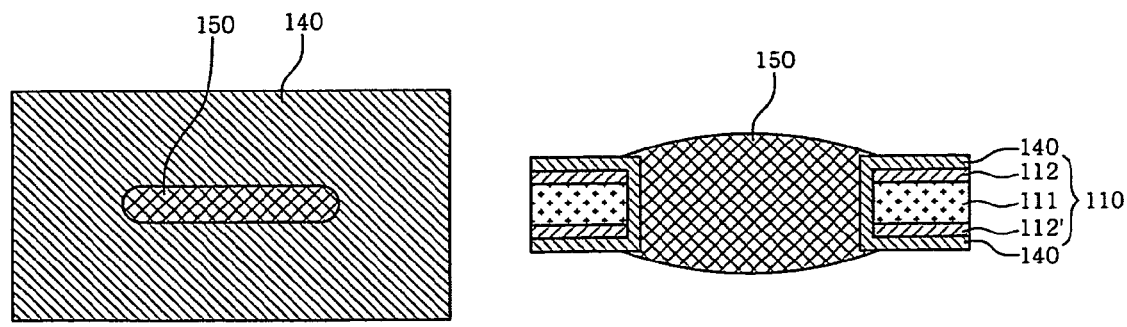
Figure 4E:
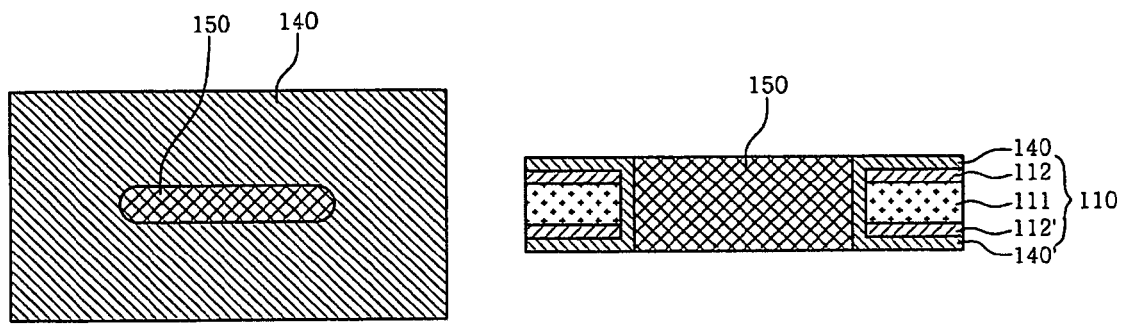
Figure 4F:
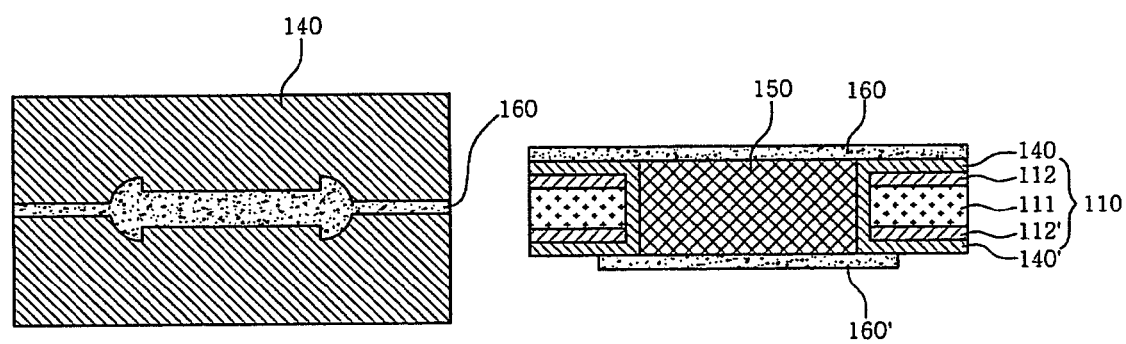
Figure 4G:
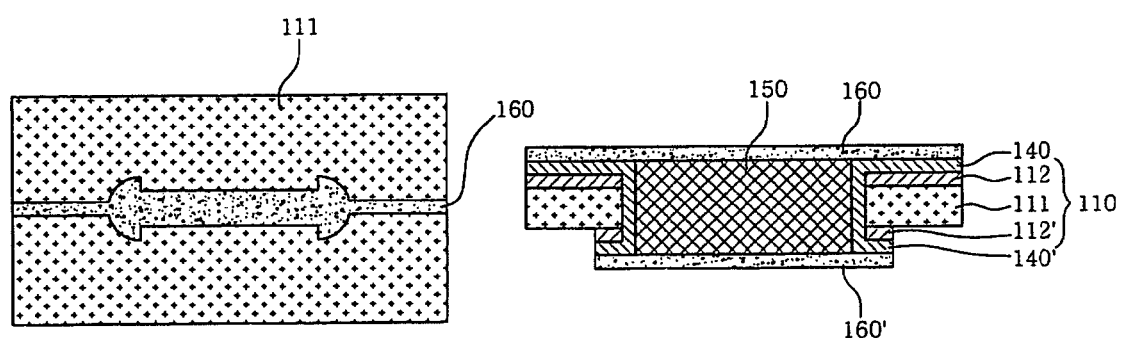
Figure 4H:
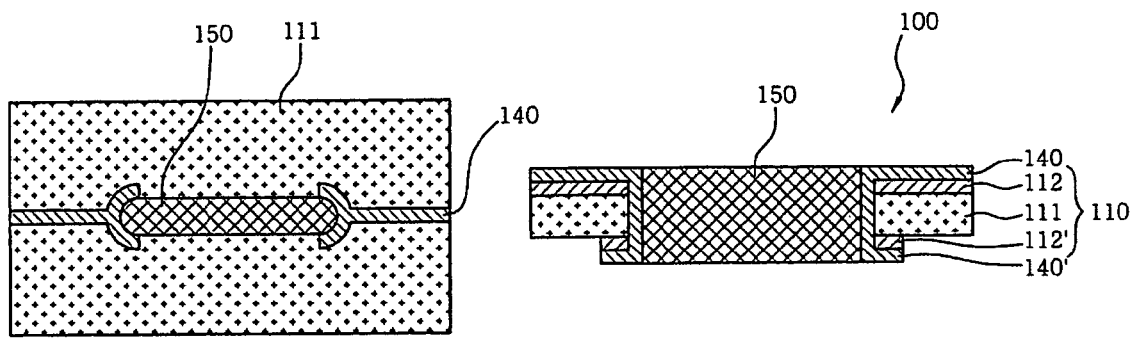
Figure 5:
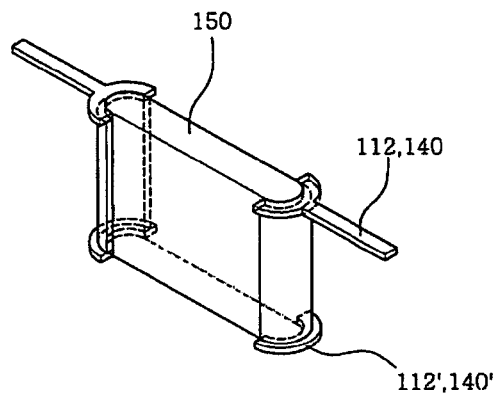
FIG. 5 is a perspective view of the embedded resistor produced according to the procedure of FIGS. 4a to 4h.

FIGS. 4a to 4h are top and sectional views illustrating a procedure of producing a PCB including an embedded resistor according to an embodiment of the present invention, and FIG. 5 is a perspective view of the embedded resistor produced according to the procedure of FIGS. 4a to 4h.

As shown in FIG. 4a, two via holes (A1) are formed through a substrate 110, namely, a copper clad laminate in which copper foil layers 112, 112' are coated on an insulating resin layer 111.

In this respect, the copper clad laminate used as the substrate 110 may be classified into a glass/epoxy copper clad laminate, a heat-resistant resin copper clad laminate, a paper/phenol copper clad laminate, a high-frequency copper clad laminate, a flexible copper clad laminate, and a composite copper clad laminate depending on the application. However, it is preferable to use the glass/epoxy copper clad laminate in which the copper foil layers 112, 112' are coated on the insulating resin layer 111, which is most frequently adopted in the course of fabricating a PCB.

Additionally, since each of the via holes (A1) formed through the substrate 110 is a through hole connecting the copper foil layers 112, 112' to each other, it is preferable to form the via holes (A1) at predetermined positions using a mechanical drill such as a computer numerical control drill (CNC drill).

After the via holes (A1) are formed using the CNC drill, it is preferable that a deburring process be conducted to remove burrs, generated during the drilling process, from copper foil layers 112, 112', and dust adhering to walls of the via holes (A1) and to surfaces of the copper foil layers 112, 112'. At this time, the surfaces of the copper foil layers 112, 112' become rough, thus improving the attachment strength of copper to the copper foil layers in a copper plating process.

Furthermore, after formation of the via holes (A1) using the CNC drill, it is preferable to conduct a desmear process so as to remove a smear which is formed on walls of the via holes (A1) by melting the insulating resin layer 111 due to heat generated in the course of forming the via holes.

As shown in FIG. 4b, copper plating layers 140, 140' are formed on the upper and lower copper foil layers 112, 112' and on walls of the via holes (A1) of the substrate 110 so as to electrically connect the via holes (A1) to each other.

At this time, the walls of the via holes (A1) of the substrate 110 each comprise the insulating resin layer 111, and thus, it is impossible to conduct an electrolytic copper plating process directly after the via holes (A1) are formed.

Accordingly, an electroless copper plating process is carried out so as to electrically connect the via holes (A1) to each other and to achieve an electrolytic copper plating process. Since the electroless copper plating process is a process of plating an insulator, it is difficult to expect a reaction caused by ions with electricity. The electroless copper plating process is achieved by a deposition reaction, and the deposition reaction is promoted by a catalyst. The catalyst must be attached to a surface of a material to be plated, so as to separate copper from a plating solution to deposit copper on the material. This means that the electroless copper plating process requires many pre-treating processes.

For example, the electroless copper plating process may include a degreasing step, a soft etching step, a pre-catalyst treating step, a catalyst treating step, an acceleration step, an electroless copper plating step, and an anti-oxidizing step.

In the degreasing step, oxides, impurities, and, particularly, oils and fats are removed from surfaces of the upper and lower copper foil layers 112, 112' using a chemical containing acid or alkaline surfactants, and the resulting copper foil layers are rinsed to completely remove the surfactants therefrom.

The soft etching step makes the surfaces of the upper and lower copper foil layers 112, 112' slightly rough (for example, a roughness of about 1–2 μm) to uniformly deposit copper particles on the copper foil layers during the plating process, and contaminants which are not removed during the degreasing step are removed from the copper foil layers.

In the pre-catalyst treating step, the substrate 110 is dipped in a dilute first catalyst-containing chemical solution to prevent a second catalyst-containing chemical solution used in the catalyst treating step from becoming contaminated and to prevent the concentration of the second catalyst-containing chemical solution from changing. Moreover, because the substrate 110 is preliminarily dipped in the first chemical solution, having the same components as the second chemical solution, prior to treating the substrate 110 using the second chemical solution, the treating of the substrate 110 using the catalyst is more effectively achieved. At this time, it is preferable that a 1–3% chemical be used in the pre-catalyst treating step.

In the catalyst treating step, catalyst particles are applied to the copper foil layers 112, 112' and insulating resin layer 111 (i.e. the walls of the via holes (A1)) of the substrate 110. The catalyst particles may be preferably exemplified by a Pd—Sn compound, and $Pd^{2-}$ dissociated from the Pd–Sn compound promotes the plating of the substrate 110 in conjunction with $Cu^{2+}$ plated on the substrate 110.

During the electroless copper plating step, it is preferable that a plating solution contain $CuSO_4$, HCHO, NaOH, and a stabilizer. It is important to control the composition of the plating solution because chemical reactions constituting the plating process of the substrate 110 must maintain an equilibrium state in order to continuously conduct the plating process. To desirably maintain the composition of the plating solution, it is necessary to properly replenish each component constituting the plating solution, to mechanically agitate the plating solution, and to smoothly operate a cycling system of the plating solution. Furthermore, it is necessary to use a filtering device to remove byproducts resulting from the reaction, and the removal of the byproducts using the filtering device helps extend of the life of the plating solution.

An anti-oxidizing layer is applied to the copper foils to prevent oxidation of the copper foils by alkaline components remaining after the electroless copper plating step during the anti-oxidizing step.

However, since an electroless copper-plating layer usually has poorer physical properties than an electrolytic copper-plating layer, the electroless copper-plating layer is thinly formed.

After the completion of the electroless copper plating process, the substrate 110 is dipped into a copper plating tub, and the electrolytic copper plating process is then conducted using a D.C. rectifier. Preferably, the electrolytic copper plating process is conducted in such a way that after an area to be plated is calculated, a proper amount of electricity is applied to the D.C. rectifier to achieve the deposition of copper.

The electrolytic copper plating process is advantageous in that physical properties of the electrolytic copper-plating layer are superior to those of electroless copper-plating layer and it is easy to form a thick copper plating layer.

As shown in FIG. 4c, a portion of the substrate between the two via holes (A1) is processed to form a elongated hole (B1) which has an elliptical section and in which the resistive material is to be packed. The copper plating layers 140, 140' remain on walls of portions of the elongated hole (B1), which each have a semicircular arc shape and are opposite to each other, because the portions are not processed. However, since the remaining portions of the elongated hole (B1), which correspond to planes opposite to each other, are formed by drilling, the insulating resin layer 111 is exposed at walls of the remaining portions. Accordingly, the semicircular-arc portions of the elongated hole (B1) which act as resistor terminals are electrically separated from each other.

At this time, it is preferable that the portion of the substrate between the two via holes (A1) be drilled using a CNC drill, a router drill, a metal mold punch or the like.

As shown in FIG. 4d, the resistive material 150 (for example, carbon resistor paste) is packed in the elongated hole (B1, B2, or B3) formed through the substrate 110 using a screen printing process.

As shown in FIG. 4e, a portion of the resistive material 150 protruded from a surface of the substrate 110 is made even using a buff.

As shown in FIG. 4f, dry films 160, 160' are coated on the upper and lower copper plating layers 140, 140' and the resistive material 150 of the substrate 110, exposed and developed using an artwork film (not shown) having a predetermined pattern printed thereon. Thereby, predetermined patterns are formed on the dry films. In this regard, the pattern includes a traditional circuit pattern (not shown), a elongated hole (B1), an embedded resistor terminal, a circuit pattern connected to the embedded resistor terminal and the like.

Each of dry films 160, 160' includes three films: a cover film, a photoresist film, and a Mylar film. Of the three films, the photoresist film substantially acts as a resist.

After the artwork film having the predetermined pattern is mounted on the dry film 160, 160', ultraviolet light is irradiated onto the artwork film to expose and develop the dry film 160, 160'. At this time, ultraviolet light is not transmitted through a black portion of the artwork film, which corresponds to the pattern, but through a remaining portion of the artwork film, on which the pattern is not printed, to harden the dry film 160, 160' under the artwork film. The substrate 110 on which the dry film 160, 160' is hardened is dipped in a developing solution for removal of the unhardened portion of the dry film 160, 160' by the developing solution. The remaining hardened portion of the dry film 160, 160' forms an etching resist pattern. In this regard, examples of the developing solution include a sodium carbonate ($Na_2CO_3$) aqueous solution and a potassium carbonate ($K_2CO_3$) aqueous solution.

As shown in FIG. 4g, the patterned dry film 160, 160' is used as an etching resist, and an etchant is sprayed onto the substrate 110 to etch and remove the portion of the upper and lower copper foil layers 112, 112' and copper plating layers 140, 140' that is not coated with the predetermined pattern of the dry film 160, 160'.

As shown in FIG. 4h, the dry film 160, 160' coated on upper and lower sides of the substrate 110 is removed using a stripping solution, such as sodium hydroxide (NaOH) or potassium hydroxide (KOH), thereby creating the PCB 100 including the embedded resistor according to the first embodiment of the present invention.

In FIGS. 4f to 4h, a liquid photosensitive substance may be used as the etching resist.

At this time, the liquid photosensitive substance, which is to be exposed to ultraviolet light, is applied to the copper plating layers 140, 140' and the resistive material 150 of the substrate 110, and then dried. Subsequently, the photosensitive substance is exposed and developed by ultraviolet light using the patterned artwork film, thereby forming a predetermined pattern thereon. Next, the patterned photosensitive substance is used as the etching resist, and the etchant is sprayed onto the substrate 110 to etch and remove the portion of the upper and lower copper foil layers 112, 112' and copper plating layers 140, 140' that is not coated with the photosensitive substance in a predetermined pattern. Next, the photosensitive substance is removed. In this regard, the liquid photosensitive substance is applied by a dip coating process, a roll coating process, an electro-depositing process or the like.

Compared to the use of the dry film 160, 160', the use of the liquid photosensitive substance is advantageous in that since it is possible to achieve a thinner coated layer, finer circuit patterns can be formed. Another advantage is that when a surface of the substrate 100 is uneven, it is possible to flatten the surface by filling recesses.

As shown in FIG. 5, in the embedded resistor according to the embodiment of the present invention, since the copper-plated walls of the via holes (A1) are used as terminals of the resistor, and the resistive material 150 is packed in an elongated hole between the via holes (A1), it is possible to form resistors having consistent resistance values because the size and length of each elongated hole (B1) are constant. Accordingly, there is an advantage in that a separate resistance-value control process such as a laser trimming process is unnecessary.

Furthermore, in the embedded resistor of the present invention, a width of the elongated hole between the via holes (A1) and the distance between the via holes (A1) may be controlled to adjust the resistance value. Therefore, it is possible to form an embedded resistor that is much thicker than the PCB, making formation of the resistor having the very large resistance value possible. This increases the freedom in designing the embedded resistor.

Figure 6A:
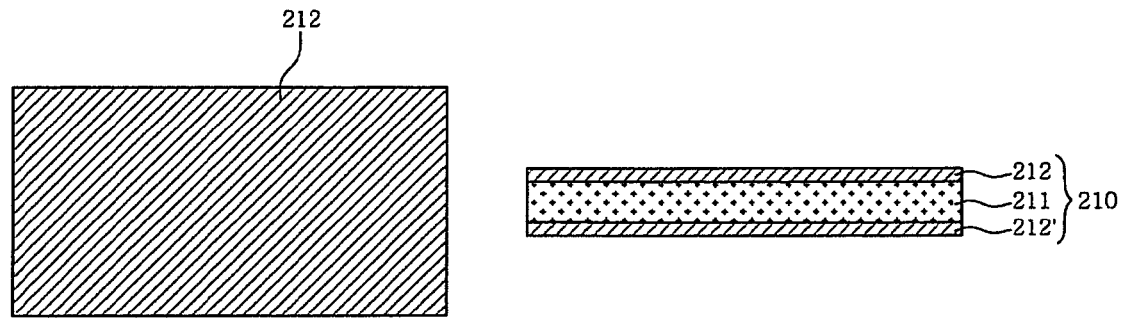
FIGS. 6a to 6m are top and sectional views illustrating a procedure of producing a PCB including an embedded resistor according to another embodiment of the present invention.
Figure 6B:
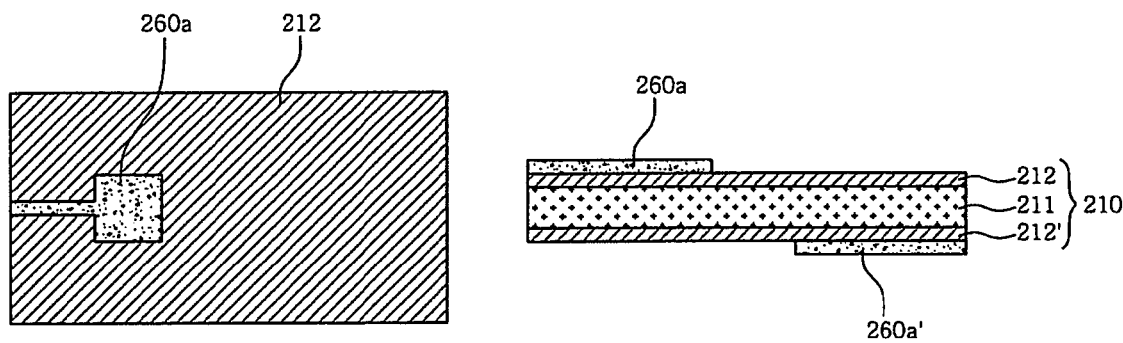
Figure 6C:
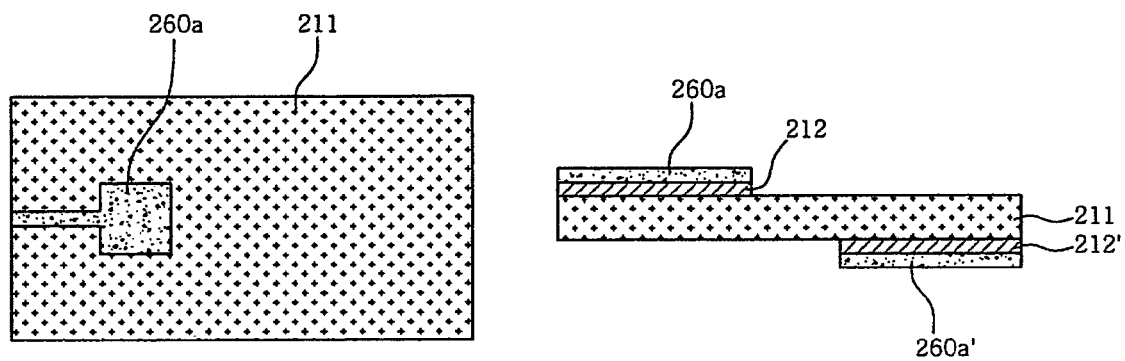
Figure 6D:
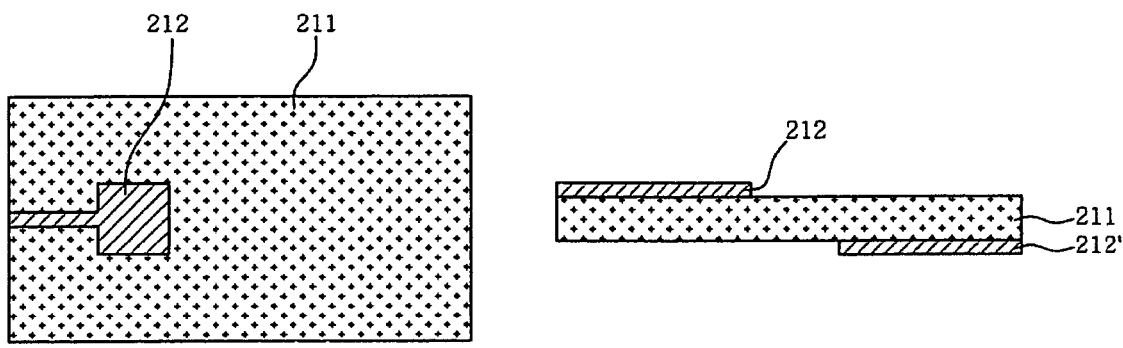
Figure 6E:
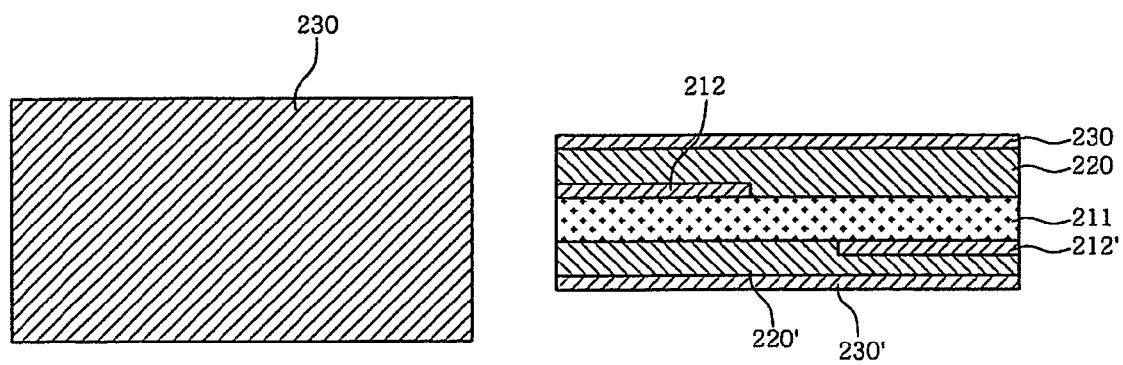
Figure 6F:
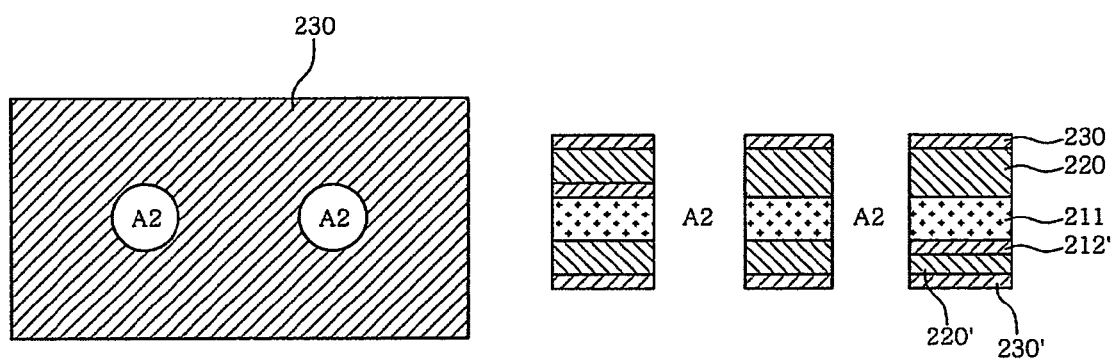
Figure 6G:
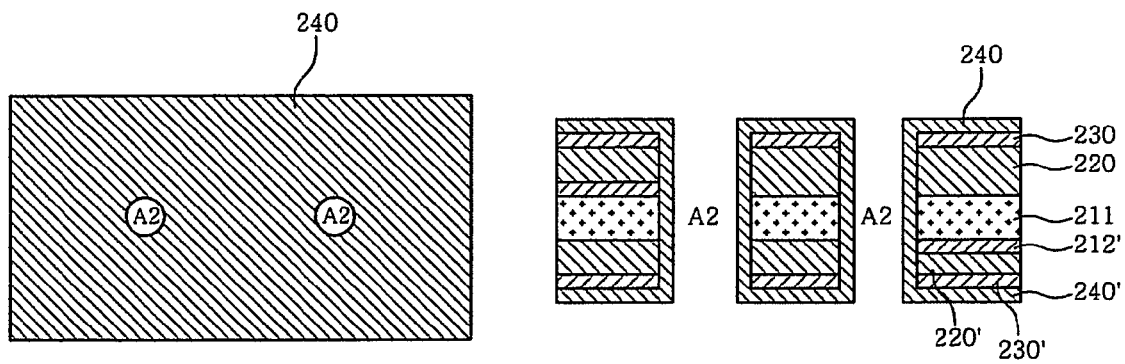
Figure 6H:
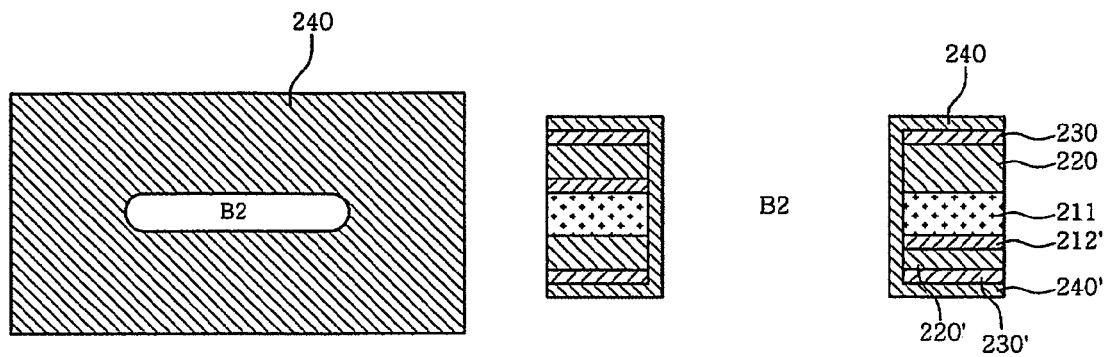
Figure 6I:
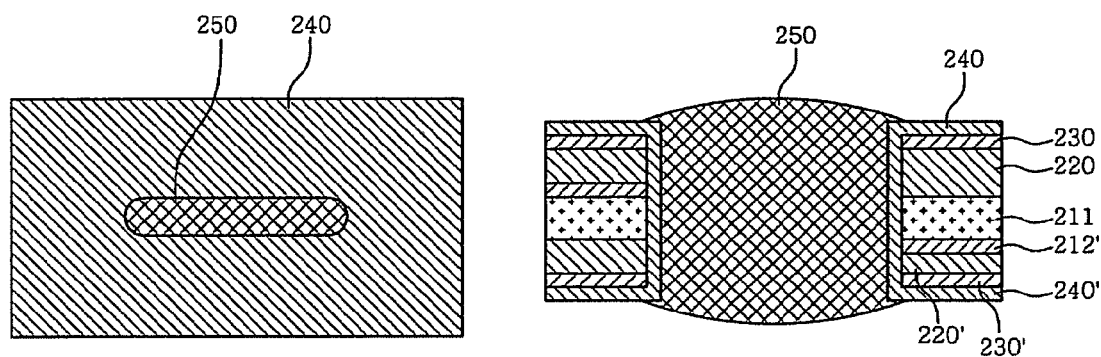
Figure 6J:
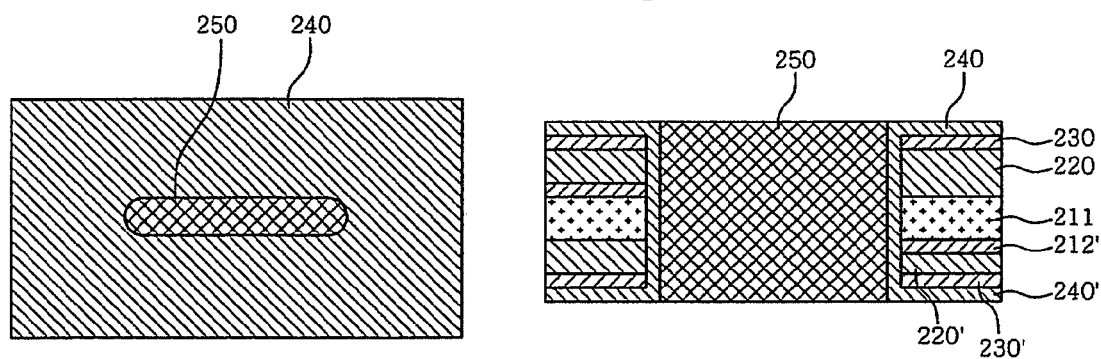
Figure 6K:
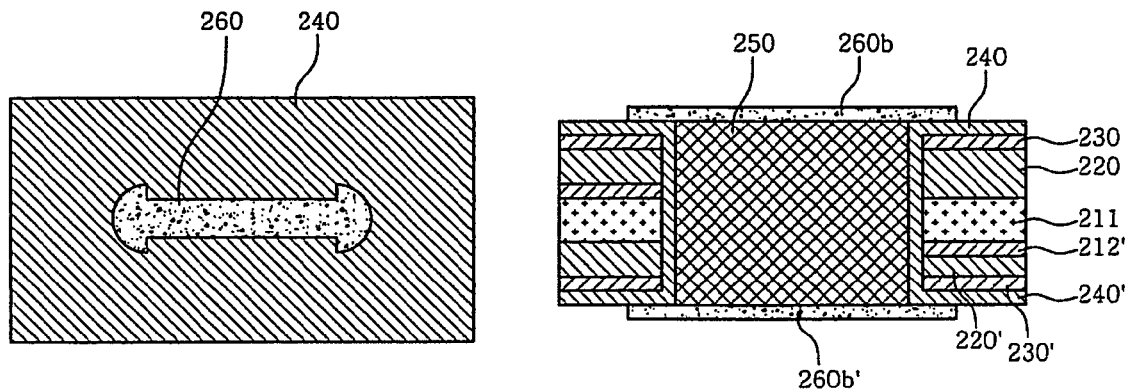
Figure 6L:
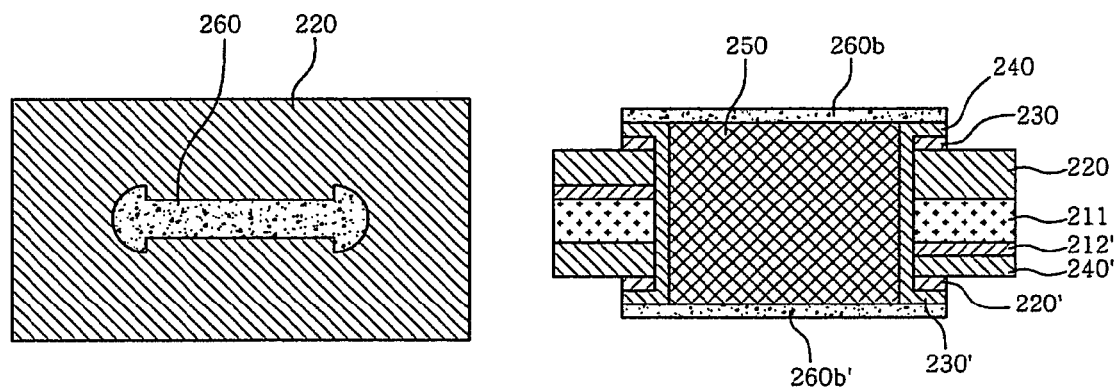
Figure 6M:
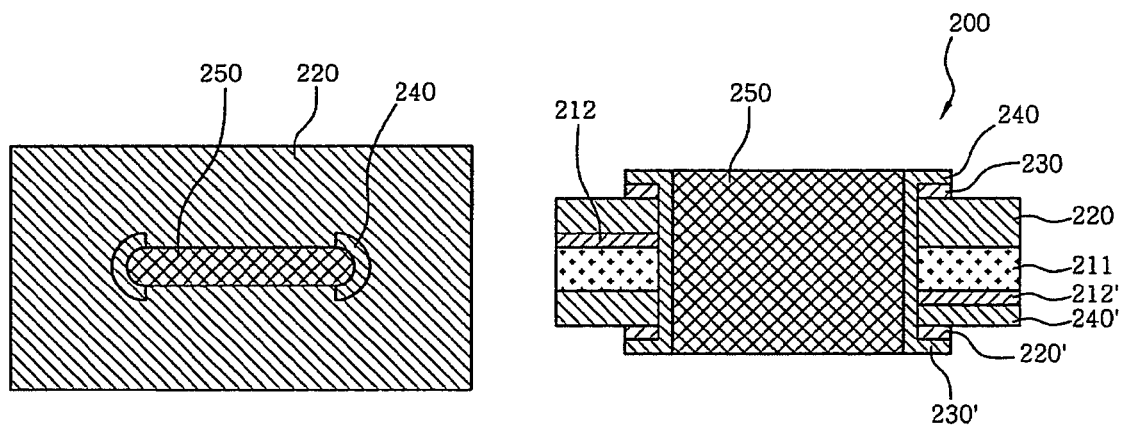
Figure 7:
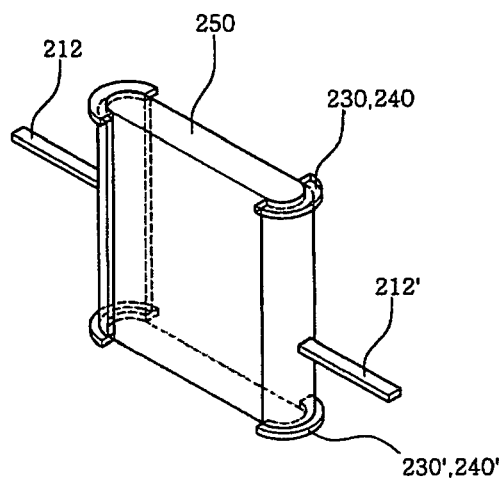
FIG. 7 is a perspective view of the embedded resistor produced according to the procedure of FIGS. 6a to 6m.

FIGS. 6a to 6m are top and sectional views illustrating a procedure of producing a PCB including an embedded resistor according to another embodiment of the present invention, and FIG. 7 is a perspective view of the embedded resistor produced according to the procedure of FIGS. 6a to 6m.

As shown in FIG. 6a, a substrate 210, namely, a copper clad laminate is provided, in which copper foil layers 212, 212' are applied to an insulating resin layer 211.

As shown in FIG. 6b, dry films 260a, 260a' are coated on both sides of the substrate 210, and exposed and developed using an artwork film (not shown) having a predetermined pattern printed thereon. Thereby, predetermined patterns are formed on the dry films. In this regard, the pattern includes traditional circuit patterns (not shown), lands through which via holes are to be formed (rectangular portions of the dry films 260a, 260a' in FIG. 6b), circuit patterns connected to the lands and the like.

In this respect, the lands through which the via holes are to be formed may have shapes (for example, circular) other than a rectangular, provided that walls of the via holes do not deviate from the lands.

As shown in FIG. 6c, the patterned dry films 260a, 260a' are used as an etching resist, and an etchant is sprayed onto the substrate 210 to etch and remove the portion of the upper and lower copper foil layers 212, 212' that is not coated with the predetermined patterns of the dry films 260a, 260a'.

As shown in FIG. 6d, the dry films 260a, 260a' coated on upper and lower sides of the substrate 210 are removed using a stripping solution, such as sodium hydroxide (NaOH) or potassium hydroxide (KOH).

As in the procedure of FIGS. 4f to 4g, in the procedure of FIGS. 6b to 6d, a liquid photosensitive substance may be used as an etching resist to form traditional circuit patterns, lands through which the via holes are to be formed, and circuit patterns connected to the lands.

As shown in FIG. 6e, insulating layers 220, 220' (for example, prepregs and copper foils 230, 230') are laminated on both sides of the substrate 210, and heated and pressed at a predetermined temperature and pressure (for example, about 150–200° C. and 30–40 kg/cm²) to form external layers. At this time, instead of the insulating layers 220, 220' and copper foils 230, 230', resin coated coppers (RCC) may be laminated on both sides of the substrate 210 to form external layers.

As shown in FIG. 6f, two via holes (A2) are formed through the lands on the copper foil layers 212, 212' of the substrate 210 so as to extend from the copper foil 230 on one side of the substrate 210 to the copper foil 230' on the other side of the substrate 210.

Since each of the via holes (A2) thusly formed is a through hole connecting the copper foils 230, 230' to each other, it is preferable to form the via holes (A2) at predetermined positions using a mechanical drill such as a CNC drill.

As well, after the via holes (A2) are formed using the CNC drill, it is preferable to conduct deburring and desmear processes.

As shown in FIG. 6g, copper plating layers 240, 240' are formed on the upper and lower copper clads 230, 230' and on walls of the via holes (A2) so as to electrically connect the via holes (A2) to each other.

In this respect, since the walls of the via holes (A2) each comprise an insulating layer, it is preferable to conduct an electrolytic copper plating process, which can form a plating layer having excellent physical properties, after an electroless copper plating process has been carried out so as to form the copper plating layers 240, 240'.

As shown in FIG. 6h, a portion of the substrate between the two via holes (A2) is processed to form a elongated hole (B2) which has an elliptical section and in which the resistive material is to be packed. At this time, the copper plating layers 240, 240' remain on walls of portions of the elongated hole (B2), which each have a shape corresponding to a semicircular arc and are opposite to each other, because the portions are not processed. However, since the remaining portions of the elongated hole (B2), which correspond to planes opposite to each other, are formed by drilling, the insulating resin layer 211 and insulating layers 220, 220' are exposed at walls of the remaining portions.

In this regard, the portion of the substrate between the two via holes (A2) is drilled using a CNC drill, a router drill, a metal mold punch or the like.

As shown in FIG. 6i, the resistive material 250 (for example, carbon resistor paste) is packed in the elongated hole (B2) using a screen printing process.

As shown in FIG. 6j, the portion of the resistive material 250 protruding from surfaces of the upper and lower copper plating layers 240, 240' is made even by use of a buff.

As shown in FIG. 6k, dry films 260b, 260b' are coated on the upper and lower copper plating layers 240, 240' and resistive material 250, and exposed and developed using an artwork film (not shown) having a predetermined pattern printed thereon. Thereby, predetermined patterns are formed on the dry films. At this time, the pattern includes a traditional circuit pattern (not shown), a elongated hole (B2), the lands of the via holes (A2) and the like.

As shown in FIG. 6l, the patterned dry films 260b, 260b' are used as an etching resist, and an etchant is sprayed to etch and remove the portion of the upper and lower copper foils 230, 230' and copper plating layers 240, 240' that is not coated with the predetermined patterns of the dry films 260b, 260b'.

As shown in FIG. 6m, the dry films 260b, 260b' are removed using a stripping solution such as sodium hydroxide (NaOH) or potassium hydroxide (KOH), thereby creating the PCB including the embedded resistor 200 according to the embodiment of the present invention.

As in the procedure of FIGS. 6b to 6d, in the procedure of FIGS. 6k to 6m, a liquid photosensitive substance may be used as an etching resist to form the traditional circuit patterns, elongated holes (B2), and lands of the via holes (A2).

As shown in FIG. 7, in the embedded resistor according to the embodiment of the present invention, the copper-plated walls of the via holes (A2) are used as resistor terminals, the resistive material 250 is packed in an elongated hole between the via holes (A2), and it is possible to form resistors having consistent resistance values because the size and length of each elongated hole (B2) are constant.

When the embedded resistors of FIGS. 5 and 7 are compared to each other, they are different from each other in that the embedded resistor of FIG. 5 employs via holes (A1) formed through two layers, whereas the embedded resistor of FIG. 7 employs via holes (A2) formed through four layers.

Furthermore, in the embedded resistor of FIG. 5, a circuit connected to the resistor terminals is exposed, but in the embedded resistor of FIG. 7, a circuit connected to the resistor terminals is connected to the walls of the via holes (A2) while not being exposed.

In the present invention, the circuit connected to the embedded resistor terminals may be formed so that the two resistor terminals are connected to one copper foil layer 112 or 112' of the substrate 210, or so that the resistor terminals are connected to the upper and lower copper foils 230, 230' and copper plating layers 240, 240' (i.e. external layer).

Furthermore, in the present invention, it is possible to fabricate an embedded resistor employing via holes formed through external layers of a six- or eight-layered PCB instead of the via holes (A2) formed through four layers.

Figure 8A:
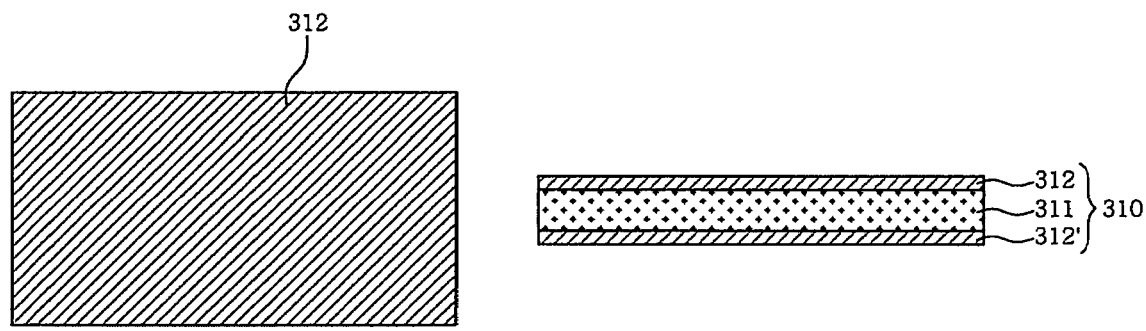
FIGS. 8a to 8n are top and sectional views illustrating a procedure of producing a PCB including an embedded resistor according to a further embodiment of the present invention.
Figure 8B:
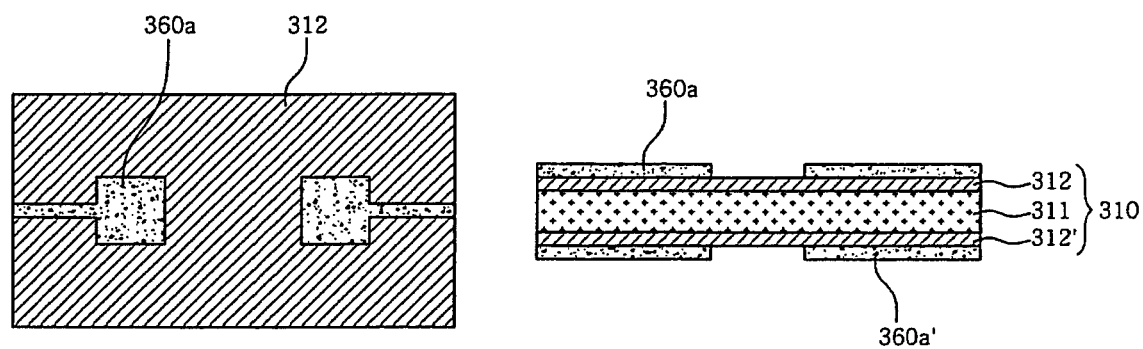
Figure 8C:
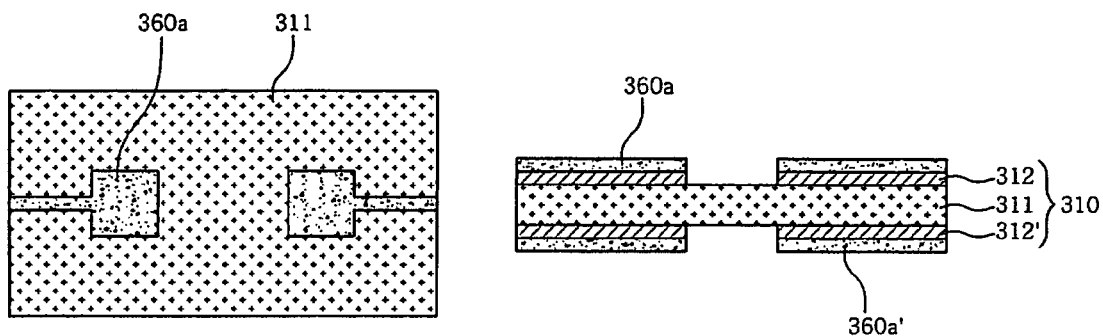
Figure 8D:
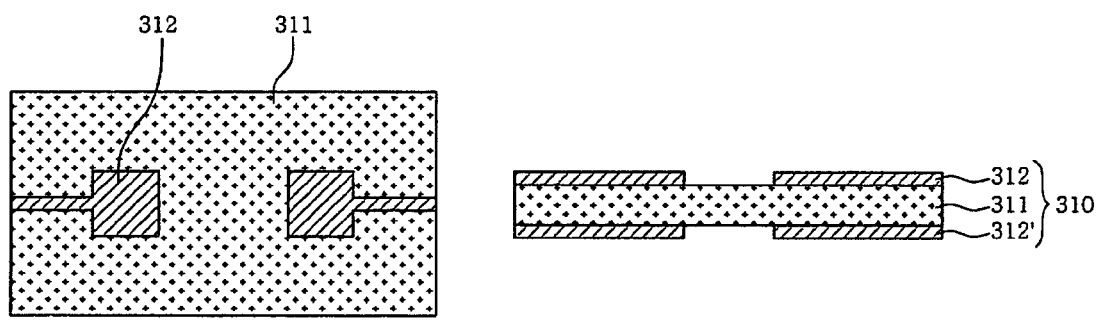
Figure 8E:
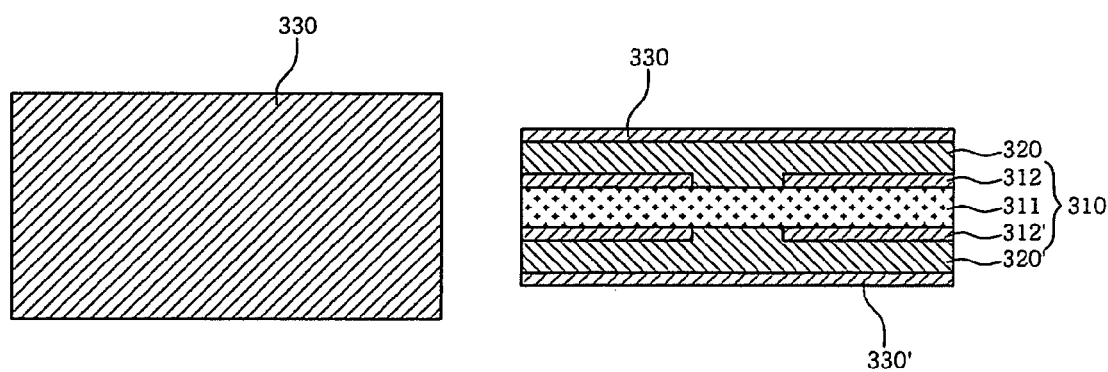
Figure 8F:
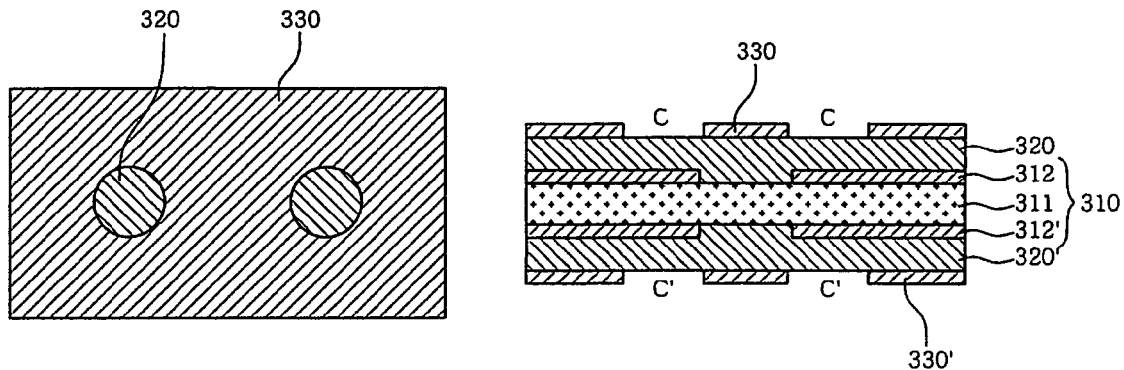
Figure 8G:
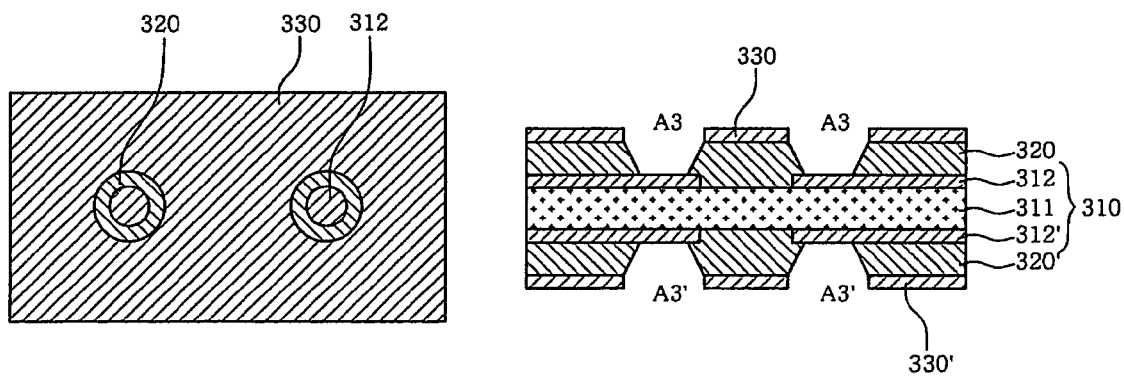
Figure 8H:
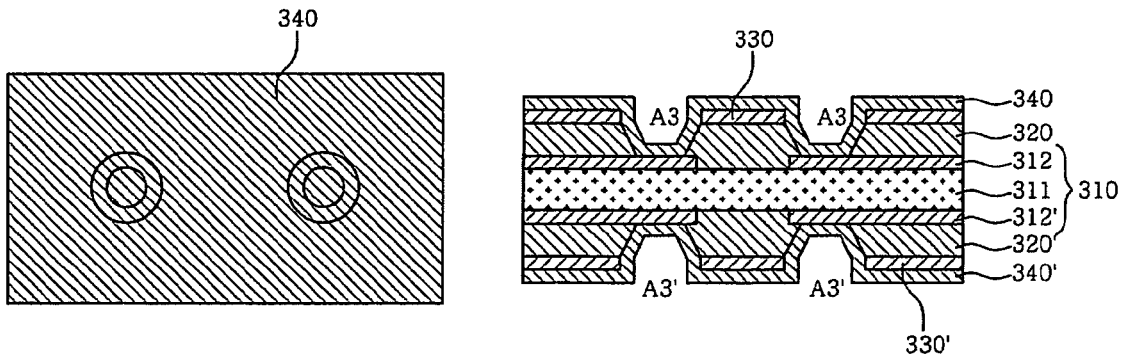
Figure 8I:
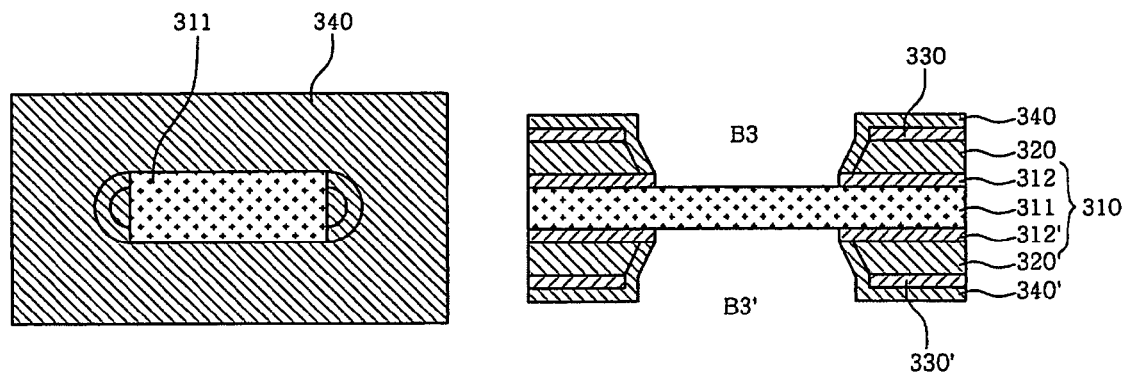
Figure 8J:
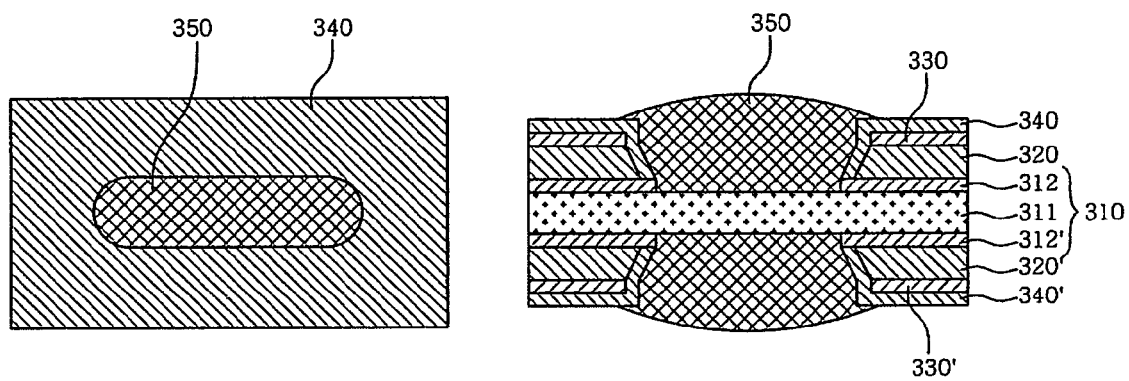
Figure 8K:
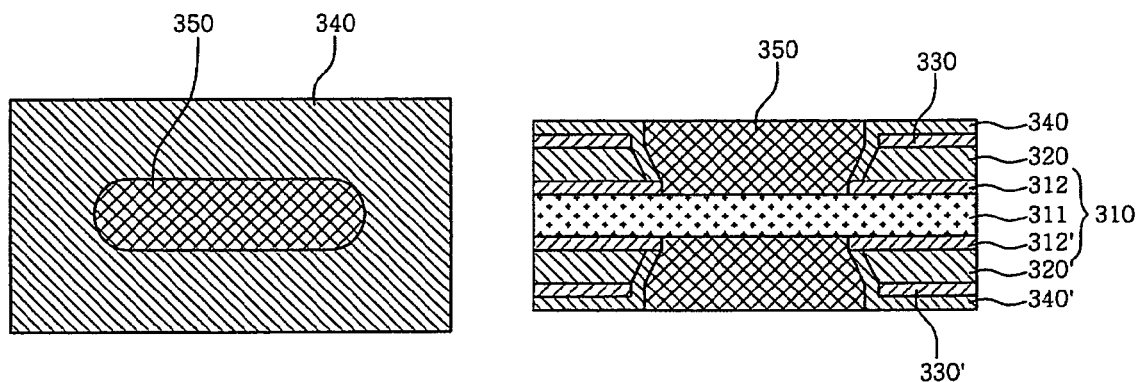
Figure 8L:
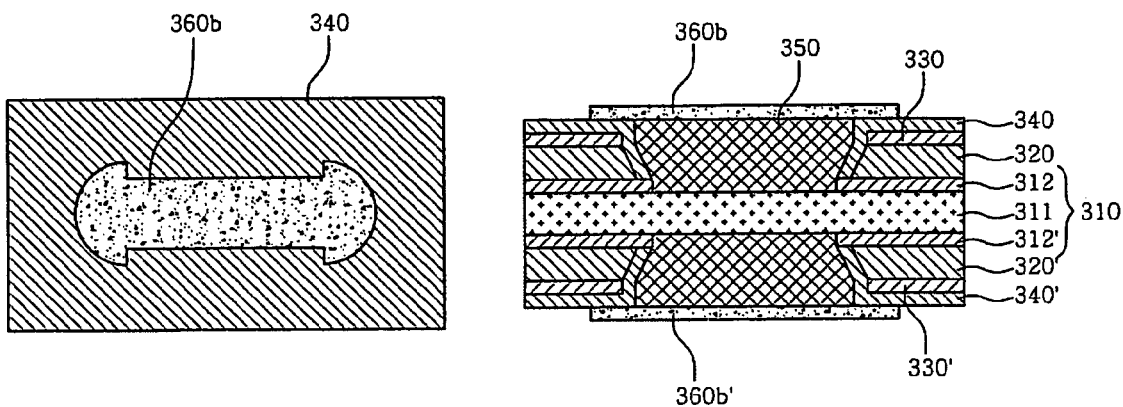
Figure 8M:
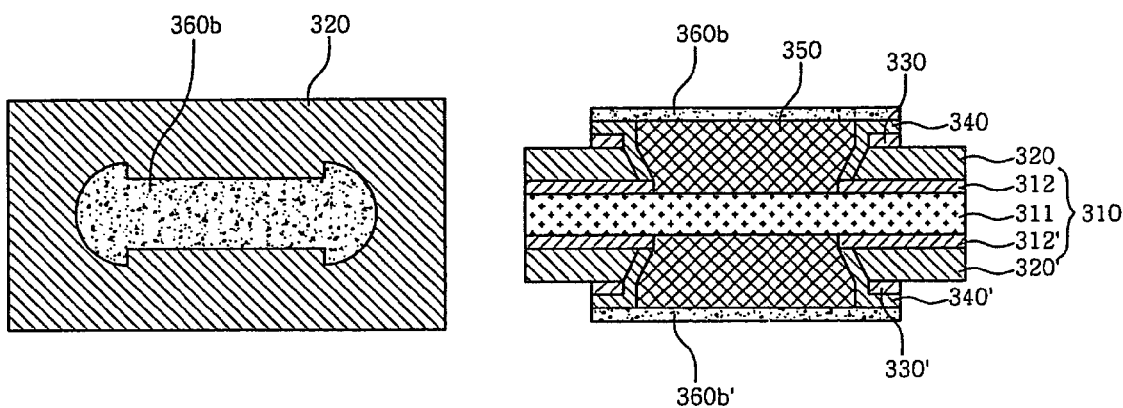
Figure 8N:
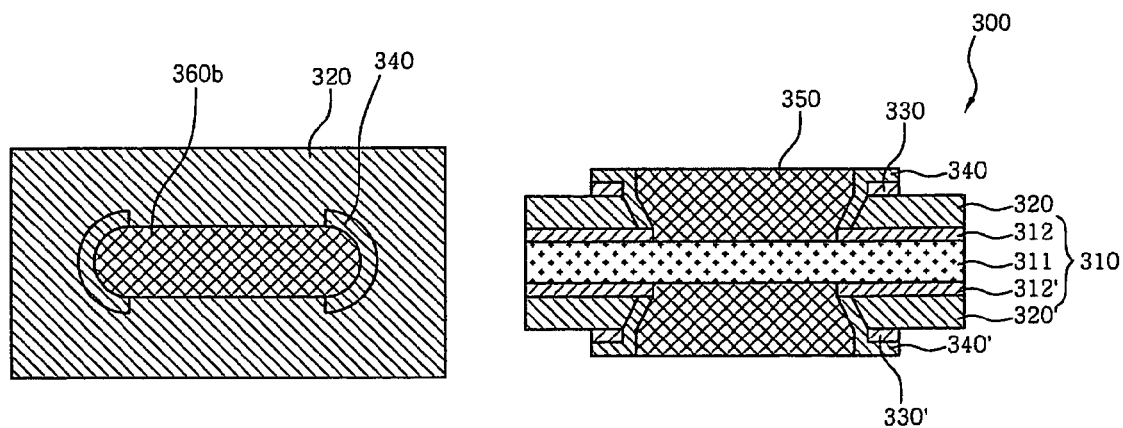
Figure 9:
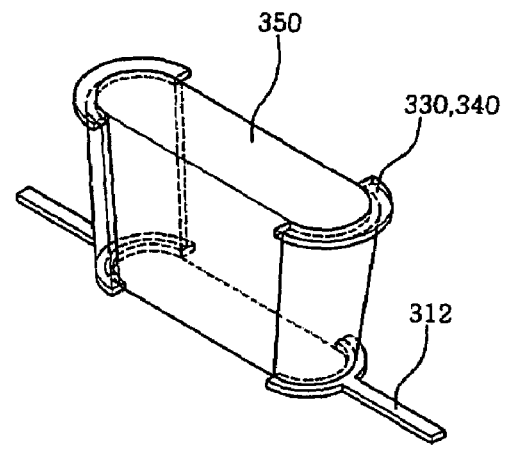
FIG. 9 is a perspective view of the embedded resistor produced according to the procedure of FIGS. 8a to 8n.

FIGS. 8a to 8n are top and sectional views illustrating a procedure of producing a PCB including an embedded resistor according to a further embodiment of the present invention, and FIG. 9 is a perspective view of the embedded resistor produced according to the procedure of FIGS. 8a to 8n.

As shown in FIG. 8a, a substrate 310, namely, a copper clad laminate, is provided, in which copper foil layers 312, 312' are coated on an insulating resin layer 311.

As shown in FIG. 8b, dry films 360a, 360a' are coated on both sides of the substrate 310, and exposed and developed using an artwork film (not shown) having a predetermined pattern printed thereon. Thereby, predetermined patterns are formed on the dry films. In this regard, the pattern includes traditional circuit patterns (not shown), lands through which via holes are to be formed (rectangular portions of the dry films 360a, 360a' in FIG. 8b), circuit patterns connected to the lands, and the like.

In this respect, the lands through which the via holes are to be formed may have shapes (for example, circular) other than rectangular, provided that walls of the via holes do not deviate from the lands.

As shown in FIG. 8c, the patterned dry films 360a, 360a' are used as an etching resist, and an etchant is sprayed onto the substrate 310 to etch and remove the portion of the upper and lower copper foil layers 312, 312' that is not coated with the predetermined patterns of the dry films 360a, 360a'.

As shown in FIG. 8d, the dry films 360a, 360a' coated on the upper and lower sides of the substrate 310 are removed using a stripping solution, such as sodium hydroxide (NaOH) or potassium hydroxide (KOH).

As in the procedure of FIGS. 4f to 4g, in the procedure of FIGS. 8b to 8d, a liquid photosensitive substance may be used as an etching resist to form the traditional circuit patterns, lands through which the via holes are to be formed, and circuit patterns connected to the lands.

As shown in FIG. 8e, insulating layers 320, 320' (for example, prepregs and copper foils 330, 330') are laminated on both sides of the substrate 310, and heated and pressed at a predetermined temperature and pressure (for example, about 150–200° C. and 30–40 $kg/cm^2$) to form external layers. At this time, instead of the insulating layers 320, 320' and copper foils 330, 330', RCC may be laminated on both sides of the substrate 310 to form the external layers.

As shown in FIG. 8f, the upper and lower copper foils 330, 330' are exposed, developed, and etched using dry films 360b, 360b' to form windows (C, C') for formation of the via holes.

As shown in FIG. 8g, the via holes (A3) are formed from the copper foils 330, 330' to the lands formed on the copper foil layers 312, 312' of the substrate 310 using the windows (C, C') formed through the upper and lower copper foils 330, 330'.

Since each of the via holes (A3) is a blind via hole with one end closed, it is preferable to drill the insulating layers 320, 320' using a laser drill to form the via holes (A3). At this time, preferable examples of the laser drill include a $CO_2$ laser drill. When the via holes (A3) are formed using a YAG (yttrium aluminum garnet) laser drill capable of drilling the copper foils 330, 330', the via holes (A3) may be formed without the formation of the windows (C, C') through the copper foils 330, 330' as shown in FIG. 8f.

As shown in FIG. 8h, copper plating layers 340, 340' are formed on the upper and lower copper foils 330, 330' and on walls of the via holes (A3) to electrically connect the via holes (A3) to each other.

At this time, since the walls of the via holes (A3) each comprise an insulator, it is preferable that after an electroless copper plating process is conducted, an electrolytic copper plating process is carried out, which can assure excellent physical properties, thereby achieving the formation of the copper plating layers 340, 340'.

As shown in FIG. 8i, a portion of the substrate between the two via holes (A3) is processed to form an elongated hole (B3) which has an elliptical section and in which the resistive material is to be packed. At this time, the copper plating layers 340, 340' remain on walls of portions of the elongated hole (B3), which each have a corresponding shape to a semicircular arc and are opposite to each other, because the portions are not processed. However, since the remaining portions of the elongated hole (B3), which correspond to planes opposite to each other, are formed by drilling, the insulating layers 320, 320' are exposed at walls of the remaining portions. The portion of the substrate between the two via holes (A3) is drilled using a CNC drill, a router drill, a metal mold punch or the like.

As shown in FIG. 8j, the resistive material 350 (for example, carbon resistor paste) is packed into the elongated hole (B3) using a screen printing process.

As shown in FIG. 8k, a portion of the resistive material 350 protruding from surfaces of the upper and lower copper plating layers 340, 340' is made even by use of a buff.

As shown in FIG. 8l, the dry films 360b, 360b' are coated on the upper and lower copper plating layers 340, 340' and resistive material 350, and exposed and developed using an artwork film (not shown) having a predetermined pattern printed thereon. Thereby, predetermined patterns are formed on the dry films. At this time, the pattern includes the traditional circuit pattern (not shown), elongated hole (B3), lands of the via holes (A3) and the like.

As shown in FIG. 8m, the patterned dry films 360b, 360b' are used as an etching resist, and an etchant is sprayed to etch and remove the portion of the upper and lower copper foils 330, 330' and copper plating layers 340, 340' that is not coated with the predetermined patterns of the dry films 360b, 360b'.

As shown in FIG. 8n, the dry films 360b, 360b' are removed using a stripping solution such as sodium hydroxide (NaOH) or potassium hydroxide (KOH), thereby creating the PCB including the embedded resistor 300 according to the third embodiment of the present invention.

As in the procedure of FIGS. 8b to 8d, in the procedure of FIGS. 8l to 8n, a liquid photosensitive substance may be used as an etching resist to form the traditional circuit patterns, elongated holes (B3), and lands of the via holes (A3).

As shown in FIG. 9, in the embedded resistor according to the embodiment of the present invention, the copper-plated walls of the via holes (A3) are used as resistor terminals, the resistive material 350 is packed in an elongated hole between the via holes (A3), and it is possible to form resistors having consistent resistance values because the size and length of each elongated hole (B3) are constant.

Furthermore, the embedded resistor employing the blind via holes according to the present invention is advantageous in that the embedded resistor can be selectively formed in a predetermined layer in a build-up process of the PCB.

Figure 10:
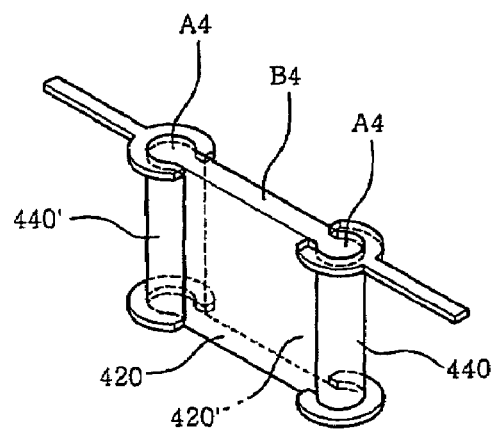
FIG. 10 is a perspective view of an embedded resistor according to another embodiment of the present invention.
Figure 11:
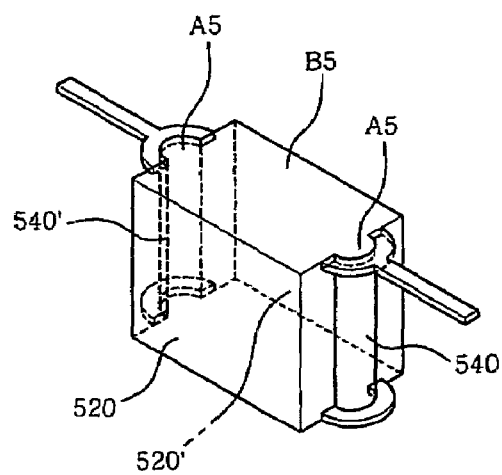
FIG. 11 is a perspective view of an embedded resistor according to an embodiment of the present invention.

FIG. 10 is a perspective view of an embedded resistor according to an embodiment of the present invention, and FIG. 11 is a perspective view of an embedded resistor according to another embodiment of the present invention.

As shown in FIG. 10, in the embedded resistor of the present invention, a space is formed between two via holes (A4), and the space has a width smaller than the diameter of each via hole (A4), thereby creating an elongated hole (B4) having a dumbbell-shaped section. This makes fabrication of an embedded resistor having a relatively large resistance value possible. In such a case, copper plating layers 440, 440' remain on walls of opposite arc-shaped ends of the dumbbell, and insulating layers 420, 420' are exposed at walls of opposite planes of the dumbbell.

Additionally, as shown in FIG. 11, in the embedded resistor of the present invention, a space is formed between two via holes (A5), and the space has a greater width than the diameter of each via hole (A5), thereby creating a elongated hole (B5) which is of a hexahedral shape having two semi-cylinders protruding from opposite sides thereof. This makes fabrication of an embedded resistor having a relatively small resistance value possible. In such a case, copper plating layers 540, 540' remain on walls of the protruded semi-cylinders, and insulating layers 520, 520' are exposed at walls of opposite planes.

Figure 12:
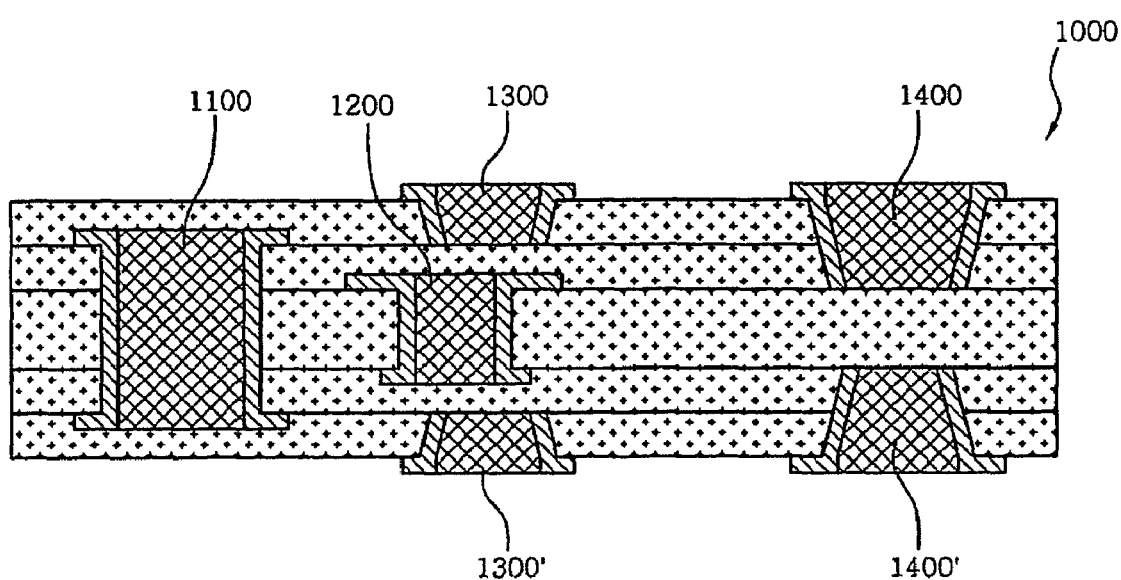
FIG. 12 is a sectional view of a PCB including a plurality of embedded resistors according to the present invention.

FIG. 12 is a sectional view of a PCB including a plurality of embedded resistors according to the present invention.

As shown in FIG. 12, the PCB 1000 including the embedded resistors of the present invention may comprise one or more of an embedded resistor 1100 employing a via hole formed through two layers, an embedded resistor 1200 employing a via hole formed through four layers, embedded resistors 1300, 1300' employing blind via holes each formed through two layers, and embedded resistors 1400, 1400' employing blind via holes each formed through three layers, depending on the purpose and application.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

As described above, the present invention provides a PCB including embedded resistors, in which a resistive material is packed in a predetermined space connecting via holes to each other and in which walls of the via holes are used as resistor terminals, thereby assuring the consistency of lengths and sizes of the embedded resistors, and a method of fabricating the same.

Accordingly, the PCB including embedded resistors and the method of fabricating the same according to the present invention are advantageous in that since the consistency of the lengths and sizes of the embedded resistors is assured, the tolerance of resistance values is very small, resulting in consistency of the resistance values of the embedded resistors.

Another advantage is that since a laser trimming process for control of the resistance values is not conducted, working speed and productivity are improved.

Still another advantage is that it is possible to fabricate a fine embedded resistor by controlling sizes of the via holes and a distance between the via holes, and thus, the number of embedded resistors per unit area can increase.

A further advantage is that the embedded resistors are formed parallel to the PCB, resulting in easy control of lengths and sectional areas of the embedded resistors.

Yet another advantage is that since the control of the lengths and sectional areas of the embedded resistors is easy, it is possible to design embedded resistors having various resistance values.

What is claimed is:

1. A printed circuit board including an embedded resistor, comprising:

a plurality of circuit layers in which circuit patterns are formed;

a plurality of insulating layers each of which interposed between the circuit layers; and the embedded resistor made of a resistive material and received in a receiving hole formed in the plurality of circuit layers and the plurality of insulating layers such that walls defining the receiving hole extends from one of the circuit layers to another circuit layer, in which the receiving hole has a closed section, and in which a conductive material is plated on opposite walls of the walls defining the receiving hole.

2. The printed circuit board as set forth in claim 1, wherein a cross section of the embedded resistor is of an oblong shape, and the conductive material is plated on the opposite walls corresponding to opposite semicircular ends of the receiving hole.

3. The printed circuit board as set forth in claim 1, wherein a cross section of the embedded resistor is of a dumbbell shape, and the conductive material is plated on the opposite walls corresponding to opposite arciform ends of the receiving hole.

4. The printed circuit board as set forth in claim 1, wherein a cross section of the embedded resistor is of a rectangular shape having semicircles protruding from opposite sides thereof, a diameter of each of the semicircles is smaller than a length of a side from which each of the semicircles protrudes, and the conductive material is plated on the opposite walls corresponding to the opposite protruding semicircular ends of the receiving hole.

5. The printed circuit board as set forth in claim 1, wherein the resistive material is a carbon resistor paste.

6. The printed circuit board as set forth in claim 1, wherein the conductive material is Cu.

7. A method of fabricating a printed circuit board including embedded resistors, comprising the steps of:

(A) forming a plurality of via holes through a substrate, and forming copper plating layers on external surfaces and walls of the via holes of the substrate;

(B) removing a portion between at least two via holes of the plurality of via holes to form a receiving hole, and packing resistive material in the receiving hole; and (C) forming predetermined circuit patterns on the substrate on which the copper plating layers are formed.

8. The method as set forth in claim 7, further comprising the steps of (D) removing a portion of the resistive material protruding from the external surfaces of the substrate so that resistance values of the resistive materials packed in the via holes are consistent after the step (B).

9. The method as set forth in claim 8, wherein the portion of the resistive material protruding from the external layers of the substrate is removed using a buff in the step (D).

10. The method as set forth in claim 7, wherein the removing of the portion between at least two via holes of the plurality of via holes is conducted using at least one of computer numerical control (CNC) drill, router drill, and metal mold punch processes, thereby forming the receiving hole in the step (B).

11. The method as set forth in claim 7, wherein the packing of the resistive materials in the receiving hole is conducted through a screen printing process in the step (B).

12. The method as set forth in claim 7, wherein the resistive material is a carbon resistor paste.

* * * * *